United States Patent [19]

Drake

[11] Patent Number: 5,023,577

[45] Date of Patent: Jun. 11, 1991

[54] FEEDTHROUGH RADIO FREQUENCY FILTER

[75] Inventor: Richard G. Drake, Ridgecrest, Calif.

[73] Assignee: The United States of America as represented by the Secretary of the Navy, Washington, D.C.

[21] Appl. No.: 524,395

[22] Filed: May 17, 1990

[51] Int. Cl.⁵ .................. H03H 7/01; H01R 13/66
[52] U.S. Cl. ............................ 333/182; 333/185; 439/607; 439/620
[58] Field of Search ................ 333/182–185, 333/12; 439/607–610, 620

[56] References Cited

U.S. PATENT DOCUMENTS

| | | | |
|---|---|---|---|
| 3,710,285 | 1/1973 | Schor et al. | 333/182 |
| 4,458,220 | 7/1984 | Carter et al. | 333/183 X |
| 4,484,159 | 11/1984 | Whitley | 333/182 |
| 4,606,598 | 8/1986 | Drzymkowski et al. | 333/182 X |
| 4,792,310 | 12/1988 | Hori et al. | 439/620 |
| 4,820,174 | 4/1989 | Farrar et al. | 439/608 X |
| 4,820,202 | 4/1989 | Edwards et al. | 439/620 |
| 4,952,896 | 8/1990 | Dawson, Jr. | 333/185 X |

OTHER PUBLICATIONS

Erie Technological Products Inc., "Erie Filters", Catalog 9001R, 1980, pp. 9, 10, 18 and 22.

Primary Examiner—Eugene R. LaRoche
Assistant Examiner—Seung Ham
Attorney, Agent, or Firm—Stephen J. Church; Melvin J. Sliwka; Sol Sheinbein

[57] ABSTRACT

A solderless, feedthrough radio frequency filter has plates with individual openings for a plurality of physically parallel, elongated conductors. To provide capacitance, the plates are constructed of electrically conductive material and the conductors covered with dielectric material where they pass through the openings. To provide inductance, the conductors are circumscribed by sets of ferrite beads adjacent to the plates. The filter may be tuned capacitively by selecting the plate thickness and tuned inductively by selecting the configuration of the beads. More complex filters may be constructed by using a plurality of plates, including non-conductive plates, and a plurality of bead sets spaced along the conductors.

20 Claims, 2 Drawing Sheets

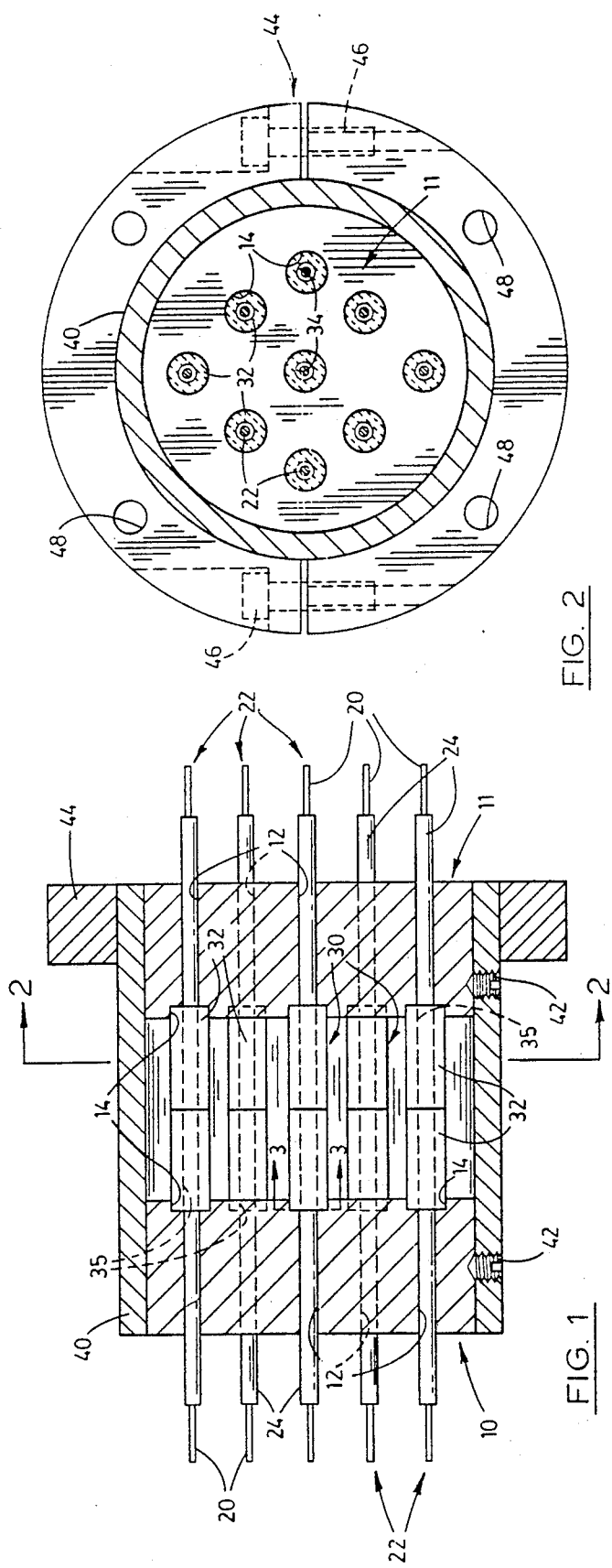
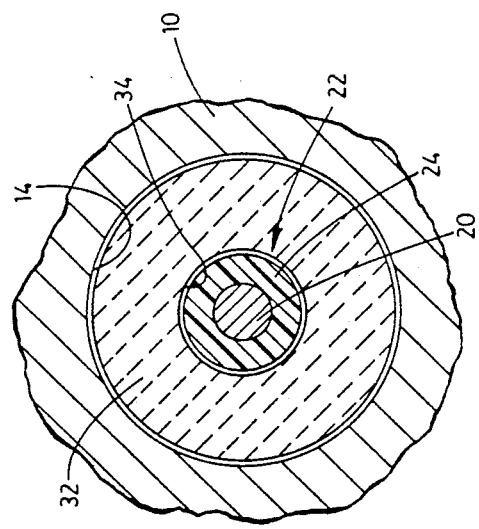
FIG. 1
FIG. 2
FIG. 3

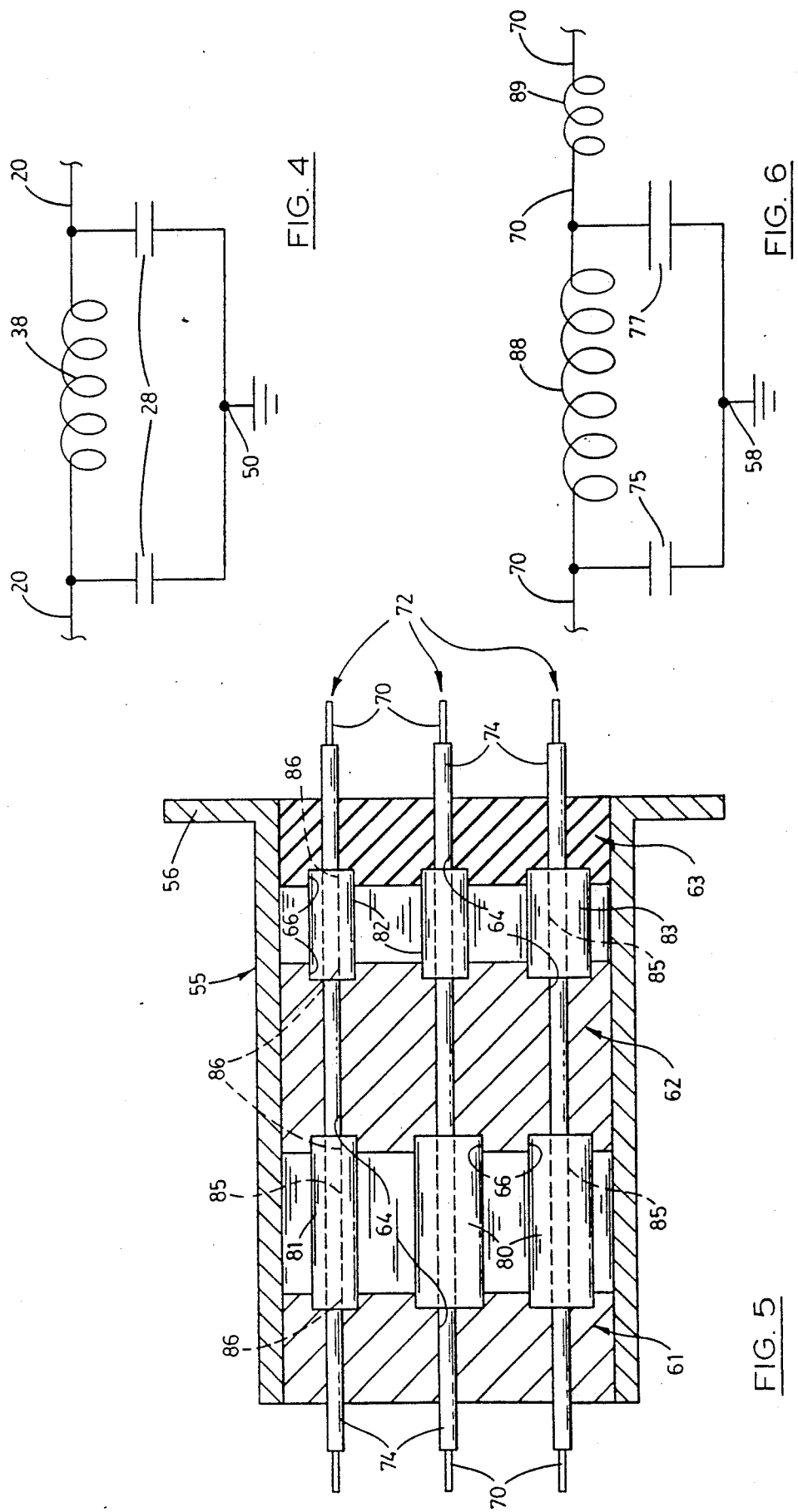

FEEDTHROUGH RADIO FREQUENCY FILTER

BACKGROUND OF THE INVENTION

1. Field of the Invention

The present invention pertains to the field of frequency domain filters of the feedthrough type.

2. Description of the Related Art

Feedthrough connectors providing electrical continuity for a plurality of physically parallel conductors through bulkheads and the like are well-known. Also well-known are integrally constructed filter devices providing inductance and capacitance and having a generally cylindrical and elongated configuration with axially oppositely extending leads for insertion of such a device in-line, as by soldering, in a single conductor such as a conventional circular wire. Such a filter device is commonly used to attenuate predetermined frequencies propagated through the device.

Typically, prior art feedthrough filters for a plurality of such parallel conductors are constructed by inserting such a filter device in each conductor adjacent to such a connector. These prior art plural feedthrough filters are relatively bulky transversely of the conductors since the filter devices are substantially larger in diameter than the conductors together with any insulation layers thereon. These prior art filters are also expensive to make and subject to defects because each of the filter devices requires a solder connection to each lead and to a ground plane. It is apparent that, in such a prior art feedthrough filter, convenience and effectiveness in soldering and reduction in size are conflicting requirements.

SUMMARY OF THE INVENTION

The present invention is a feedthrough radio frequency filter particularly adapted for use with a plurality of conductors which are physically parallel and, typically, are continuous, insulated circular wires. The filter has a plurality of plates which, typically, are discoidal. At least one of the plates is electrically conductive and each plate has a plurality of openings corresponding individually to the conductors. Within the openings of a conductive such plate, the conductors are coated with dielectric material, such as the conventional insulation of such wires, so that a capacitance is provided where each conductor passes through the plate, the capacitance being determined by the plate thickness and by the thickness and dielectric constant of the dielectric material. Adjacent to the plates, the conductors are circumscribed by ferrite beads to provide inductances determined by the number of the beads and their dimensions. The capacitances and inductances so provided may be selected to attenuate undesired frequencies propagated along the conductors. More complex filters are constructed by using a plurality of such bead sets separated by such a plate and by using a number of such plates, some of which may be nonconductive, spaced apart along the conductors with the plate openings aligned and with the conductors passing sequentially through the openings.

An object of the present invention is to provide a feedthrough radio frequency filter which is compact and is simple to construct and assemble.

Another object is to provide such a feedthrough filter for a plurality of conductors.

Another object is to provide such a feedthrough filter particularly adapted to such conductors which are physically parallel wires.

A further object is to provide such a filter which is constructed without the use of soldering.

Yet another object is to provide such a filter easily adaptable to different frequencies and to different capacitance and impedance arrangements.

Still other objects are to provide a feedthrough filter which has the above and other advantages and which is low in cost, rugged, and fully effective.

BRIEF DESCRIPTION OF THE DRAWINGS

Other objects, advantages, and novel features of invention will become apparent from the following detailed description when considered with the accompanying drawings in which:

FIG. 1 is an axial section of a "pi" feedthrough radio frequency filter which is a first embodiment of the present invention;

FIG. 2 is a section of the filter of FIG. 1 taken at line 2—2 thereof;

FIG. 3 is a section of the filter of FIG. 1 taken at line 3—3 thereof and at an enlarged scale;

FIG. 4 is an electrical schematic of the filter of FIG. 1;

FIG. 5 is an axial section of a feedthrough radio frequency filter which is a second embodiment of the present invention; and FIG. 6 is an electrical schematic of the filter of FIG. 5.

DESCRIPTION OF THE PREFERRED EMBODIMENTS

First Embodiment

FIGS. 1-3 depict the structure of a feedthrough radio frequency filter which is a first embodiment of a of the present invention and which provides the electrical characteristics of a well-known "pi" filter shown in FIG. 4.

The filter has a pair of substantially identical cylindrical plates or disks 10 and 11 which are adjacent and are disposed in coaxially aligned and axially spaced relation. Each disk has a plurality of cylindrical openings or bores 12 which extend through the disk and are axially parallel therewith. The disks 10 are disposed so that each bore 12 in one disk is in axial alignment with a bore 12 in the other disk, this alignment being in a direction along the axes of the disks. In each disk, the ends of bores 12 facing the other disk have counter bores 14.

Disks 10 and 11 are constructed of metal and are thus electrically conductive. In the claims, therefore, elements corresponding to disks 10 and 11 are sometimes referred to as a "first plate" or a "second plate" of "electrically conducting material", and bores 12 are sometimes referred to, for reasons subsequently apparent, as "parallel capacitive openings" or as "capacitance openings" with the bores in one disk sometimes being termed "first capacitive openings" and those in the other disk being termed "second capacitance openings".

For illustrative convenience, each disk 10 or 11 is depicted as having nine of the bores 12; however, it will be apparent that the present invention may be practiced with some lesser or greater number of similar bores. It will also be apparent that the invention may be practiced with elements which correspond to disks 10 and and to bores 12, but are of rectangular or other non-circular configuration.

The feedthrough filter has, or may be considered as being used with, a plurality of cores or conductors 20 which are equal in number to the number of bores 12 in one of the disks 10 or 11 and which correspond individually to the bores 12 in each disk 10 or 11. Conductors 20 are disposed generally in physically parallel relation, but are not necessarily connected in electrically parallel relation. The present invention is particularly advantageous when conductors 20 are, as depicted in FIGS. 1-3, the continuous metal cores of conventional circular wires which are identified by the numerals 22. Each wire 22 is continuous and corresponds to one of the bores 12 in each disk 10 or 11. For the purposes of the present application, each wire 22 is considered as including the conductor or core 20 and as including a continuous, hollow cylindrical covering or layer 24 of electrically insulating and dielectric material which completely covers and circumscribes the core and, typically, adheres thereto. Covering 24 is advantageously constructed of the polytetrafluoroethylene synthetic resin material, which is sold under the trademark "TEFLON", because of the dielectric and antifriction properties of this material.

The transverse cross sections of the bores or openings 12 and wires 22 conform to each other, and the diameters of bores 12 are, preferably, selected in relation to the peripheral or exterior diameters of layers 24 so that each wire 22 is slidably fitted in the corresponding bore 12, sliding movement of the wires relative to the bores being facilitated by the antifriction properties of the material forming layers 24. Wires 22 with their conductors 20 and layers 24 extend in a direction generally along the aligned axes of disks 10 and 11, and each wire and conductor extends through the corresponding bore 12 in one of the disks 10 or 11 and then, sequentially, through the corresponding bore in the other of these disks.

It is apparent that, in each electrically conducting disk 10 or 11, the dielectric layer 24 of each wire 22 is disposed within the bore 12 corresponding to the wire and thus also corresponding to the conductor or core 20 of the wire. This layer is thus disposed about the conductor and between the conductor and each disk 10 and 11. It is evident that a capacitance is defined between the conductor 20 and each disk, this capacitance having the layer as a dielectric and being indicated in FIG. 4 by numeral 28. This capacitance may be easily calculated from well-known rules for determining the capacitance of coaxial conductors which have predetermined dimensions and which are separated by a material having a predetermined dielectric constant.

The feedthrough filter of FIGS. 1-3 has a plurality of inductive elements 30 disposed between disks 10 and 11, each element 30 consisting of a pair of hollow cylindrical beads 32 constructed of ferrite material. Such beads are well-known and are available in a wide variety of lengths and interior and exterior diameters so as to provide for an electrical conductor, such as a core 20 extending through the bead, an increased inductance which is easily determined by those skilled in the art. Each element 30 is depicted as having a pair of the beads 32 disposed in axially aligned end-to-end relation as might be required to provide the proper bead length for a desired such inductance; however, it will be apparent to one skilled in the art that a single longer bead or, in the absence of transverse dimensional restraints, a single larger diameter bead may be used to provide a desired inductance.

Elements 30 and beads 32 correspond individually to wires 22 and their conductors 20 and layers 24, and each bead has a central bore or inductive opening 34 having axially opposite open ends 35 disposed at opposite axial ends of the bead. The transverse cross sections of bores 34 conform to the cross sections of the corresponding wires 22 and have diameters selected in relation to the peripheral or exterior diameters of the corresponding layers 24 so that each wire 22 is slidably fitted to the corresponding bore 34 with sliding movement of the wire relative to the bore being facilitated by the antifriction properties of the material forming the layer 24. Each wire 22 and its core 20 extend through the bore 34 of each bead 32 corresponding to the wire in a direction along the axes of disks 10 and 11. The bead thus circumscribes the conducting core 20 of the wire and is juxtapositioned to the core so that the bead defines an increased inductance for the core as described in the above paragraph, this inductance being indicated in FIG. 4 by numeral 38.

In the filter of FIGS. 1-3 and as best shown in FIG. 1, each counterbore 14 of a bore 12 is dimensioned so as to slidably and coaxially receive the exterior of the bead 32 fitted to the wire 22 corresponding to the bore. The filter is assembled with the axially opposite pair of bead ends 35 of each inductive element 30 fully inserted into the corresponding counterbores 14 and with the other pair of bead ends of the element engaged centrally thereof. Each element 30 is thus juxtapositioned to the disks 10 and 11, and the opposite axial ends of the element are engaged by the disks. It is evident that, as a result of this construction, each bead 32 and its inductive opening or bore 34 is aligned with the corresponding capacitive opening or bore 12 in one of the disks 10 or 11.

Disks 10 and 11 and beads 32 are, preferably, secured in their respective positions, as described above and as best shown in FIGS. 1 and 2, by a cylindrical sleeve 40 which internally receives the disks and maintains them in coaxial alignment. The disks and beads may be secured in position axially of the sleeve and in engagement with beads 32 by setscrews 42 extending radially through the sleeve into the disks. For feedthrough of the wires 22 through a bulkhead or the like, not shown, in a direction axially of the disks and normal to the bulkhead, the filter may be mounted on the bulkhead by an annular clamp 44 fitted to the exterior of the sleeve. The clamp may be split diametrically and secured together and to sleeve 40 by a pair of screws 46. Clamp 44 has a plurality of bores 48 extending through the clamp parallel to the axis of sleeve 40 to 10 receive screws or the like, not shown, for affixing the filter to the bulkhead.

As a result of the structure described above, disks 10 and 11, sleeve 40, clamp 44, and a bulkhead to which these elements are fixed serve as a ground plane, identified in FIG. 4 by numeral 50, for the capacitances 28. This structure thus provides a "pi" filter in which the pair of capacitances 28 defined by the adjacent disks 10 and 11 are connected to ground plane 50 oppositely of the inductance 38 defined by an element 30 which is in series with the conductor or core 20.

Example of the First Embodiment

A feedthrough radio frequency filter, which embodies the principles of the present invention and corresponds to the "pi" filter of FIGS. 1-4, was constructed. The filter has two disks corresponding to disks 10 and 11 and constructed of aluminum alloy, each disk being 1.295 inches (32.9 mm) in diameter and having an axial thickness of 0.75 inch (19.0 mm). Each disk has twenty-seven bores corresponding to bores 12. Each bore is 0.055 inch (1.4 mm) in diameter and has at one end a counterbore, which corresponds to a counterbore 14, of 0.140 inch (3.6 mm) diameter and 0.062 inch (1.6 mm) in depth. The filter has twenty-seven circular wires corresponding to wires 22, each wire corresponding individually to one of the bores in each disk and being continuous where the wire extends through and between its bores in both disks. Each wire has a number 24 AWG copper conductor corresponding to a core 20, the conductor being covered with a continuous layer of the electrical insulating and dielectric material "TEFLON" adhering to the conductor. This layer has an outside diameter of 0.044 inch (1.1 mm). Each wire extends through a pair of cylindrical ferrite beads, which correspond to beads 32 and are disposed in axial end to end relation between the disks with the opposite ends of the bead pair received in the corresponding counterbores in the disks. Each bead has a length of about 0.233 inch (5.9 mm), an inner diameter of 0.05 inch (1.3 mm), and an outer diameter of about 0.125 inch (3.2 mm). The filter was assembled by drawing the wires through the bores in one of the disks, inserting each wire through a pair of the ferrite beads, drawing the wires through the bores in the other of the disks, and urging the disks toward each other until the beads were firmly engaged with each other and firmly engaged with the disks within the counter bores. Finally, the disks were fixed in axial alignment with the beads so engaged by the use of a sleeve corresponding to sleeve 40.

The assembled filter was tested with radio frequency energy of about 1-4 GHz propagated along each of the wires, and the filter was found to attenuate this energy by a factor of 18 dB.

Second Embodiment

FIGS. 5 depicts the structure of a feedthrough radio frequency filter which is a second embodiment of the present invention and which has elements selected to show the variety of filter arrangements which may be constructed in accordance with the invention. FIG. 6 shows the electrical characteristics of the specific FIG. 5 arrangement, but it will be apparent that other filter arrangements, which may be conveniently constructed in accordance with the invention, will have other electrical characteristics.

The filter of FIG. 5 has a sleeve 55 which is to be considered as cylindrical and thus corresponds to sleeve 50. Sleeve 55 has an integral and annular flange 56, which is an alternative to a clamp such as clamp 44, for mounting the filter on a bulkhead or the like and for providing a common ground plane, indicated in FIG. 6 by numeral 58, for the filter and the bulkhead. The FIG. 5 filter has three plates or disks 61-63 which are adjacent and are fixed in coaxially aligned and axially spaced relation by sleeve 55. The three disks 61-63 are similar to disks 10 and 11 in that each of the three disks has a plurality of bores 64 which extend through the disk parallel to its axis. Each of the three disks has the same number of the bores 64, and the three disks are disposed so that a bore 64 in each one of the disks is aligned axially with a bore 64 in each of the other disks. In each of the three disks, each end of a bore 64 disposed toward another of the disks terminates in a counterbore 66. Disks 61-63 are secured in coaxial alignment by sleeve 55 and are secured in position axially in the sleeve and connected electrically to the sleeve and each other in any suitable manner, not shown.

The FIG. 5 filter is similar to that of FIGS. 1-3 in having a plurality of conductors 70 which are equal in number to the number of bores 64 in each of the three disks 61-63, each conductor corresponding individually to one of the bores 64 in each of the three disks. Conductors 70 are disposed generally in physically parallel relation, but need not be electrically parallel. Conductors 70 are similar to conductors 20 in being the continuous metal cores of conventional and continuous circular wires 72 each having a hollow cylindrical covering or layer 74 which completely covers and circumscribes the core and adheres thereto. Layers 74 are advantageously constructed of the "TEFLON" material described above in connection with layers 24. The transverse cross sections of the bores 64 conform to those of wires 72, and the diameters of bores 64 are selected so that each wire 72 is slidably fitted in the corresponding three of the bores 64. Wires 72 with their conductors 70 and layers 74 extend along the aligned axes of disks 61-63 with each wire and conductor extending sequentially through the corresponding bores 64 in disks 61, 62, and 63.

Disks 61 and 62 are constructed of electrically conductive material similarly to disks 10 and 11 so that the bores 63 in each disk 61 or 62 are, similarly to bores 12, parallel capacitive bores. However, disk 63 is constructed of any electrically nonconducting material having suitable structural properties. In the claims, therefore, an element corresponding to disk 61 or 62 is sometimes referred to as a "first plate of electrically conducting material"; an element corresponding to disk 63 is referred to as a "second plate of electrically nonconducting material"; and the bores in this second plate which correspond to bores 64 in disk 63 are referred to simply as "parallel bores".

Electrically conducting disks 61 and 62 are similar to disks 10 and 11 in that capacitances, which are indicated respectively in FIG. 6 by numerals 75 and 77 and have layers 74 as a dielectric, are defined between disks 61 and 62 and the conductors 70. It will be noted that disk 62 is axially thicker than disk 61 and that capacitance 77 is, correspondingly, depicted as greater than capacitance 75.

The filter of FIG. 5 has a plurality of inductive elements or ferrite beads 80-83 corresponding to beads 32 of FIG. 1. The beads 80-83 identified by different numerals have different lengths and/or diameters. Each bead 80-83 corresponds individually to a wire 72 and to the conductor 70 and layer 74 thereof. Each bead has a central bore or inductive opening 85 having axially opposite open ends 86 disposed at opposite axial ends of the bead, each of these bead ends being slidably fitted to and received in a corresponding one of the counter bores 66. The transverse cross sections of bores 85 conform to the cross sections of the corresponding wires 72 and have diameters selected in relation to the peripheral or exterior diameters of the corresponding layers 74 so that each wire 72 is slidably fitted to the corresponding bore 85 with sliding movement of the wire relative to the bore being facilitated by the antifriction properties of the material forming the layer 74. Each wire 72 and its conductor 70 extend through the bore 85 of each bead 80-83 corresponding to the wire in a direction along the axes of disks 61-63. The bead thus circumscribes the conductor 70 of the wire and is juxtapositioned to the conductor so that the bead defines thereat an increased inductance for the core.

Two such inductances along one of the conductors 70 are indicated in FIG. 6 by numerals 88 and 89, with such an inductance defined by a bead 80 or 81 between disks 61 and 62 being indicated by numeral 88 and such an inductance defined by a bead 82 or 83 between disks 62 and 63 being indicated by numeral 89. Since beads 80 and 81 are longer than beads 82 and 83, disks 61 and 62 are spaced farther apart axially than disks 62 and 63 so that, for beads such as 81 and 82 of substantially the same interior and exterior diameters, inductance 88 is greater than inductance 89. The beads, such as 80 and 81 or 82 and 83, disposed axially between the same pair of disks 61–63 may be of different exterior diameters so that, between the same pair of these disks, different inductances may be provided for different conductors 70.

It is evident from FIGS. 5 and 6 that an "L" filter is defined by the electrically conductive disk 62, the adjacent electrically nonconductive disk 63, and the inductive element consisting of a bead 82 or 83 disposed between these disks and corresponding to a conductor 70. In this "L" filter, capacitance 77, which is defined by disk 62 and is connected to ground plane 58, is adjacent to inductance 89, which is in series with conductor or core 70, and disk 63 provides structural support to wires 72 and to beads 82 and 83. 15 It is also evident from FIGS. 5 and 6 that the capacitance 75 defined by electrically conductive disk 61 and the inductance 88 defined by a bead 80 or 81 form another "L" filter or filter cell in series with the "L" filter cell defined by capacitance 77 and inductance 89. It is apparent that a structure of the present invention can provide a feedthrough filter having any practical number of such cells with the cells having the same or different values for the inductances and capacitances. It is further apparent that a structure similar to that of FIG. 5, but having a disk corresponding to disk 61 constructed of electrically nonconductive material, would form a "T" filter having a pair of inductances opposite a capacitance to ground. Still other feedthrough radio frequency filter arrangements may be constructed in accordance with the present invention by using other arrangements of conductive and nonconductive elements, which correspond to disks 10, and 61–63 and which have aligned openings corresponding to bores 12 and 64. In such other filter arrangements, as in the arrangements of FIGS. and 5, these aligned openings are also aligned with ferrite beads, such as beads 32 and 80–83, which are disposed between and engage such conductive and nonconductive elements, such other arrangements having wires, such as wires 22 and 72, extending through the openings and the beads.

Method of Constructing the Embodiments

A feedthrough radio filter which embodies the present invention is preferably constructed by a method now to be described. The filter includes capacitive and support elements which are typified by disks 10, 11, and 61–83. Each of the disks has openings such as bores 12 and 64. The filter also includes inductive elements such as ferrite beads 32 and 80–83. The filter further includes elements such as wires 22 or 72 each having a conductor such as core 20 or 70 covered with a layer, such as a layer 24 or 74, of material with suitable electrical insulating, dielectric, and anti-friction properties. When assembled, the filter may have such capacitative and support elements arranged as in FIG. 1 or in FIG. 2 or may have some other number and/or axial sequence of electrically conducting and nonconducting such elements.

The filter is made by, first, constructing or otherwise obtaining the requisite elements. Next, a plurality of continuous wires, each of which consists of such a core and layer, are then drawn individually through the bores, such as bores 12 or 64, in a first disk such as a disk 10 or 61. These bores are, of course, capacitive openings in such a disk which is constructed of electrically conducting material. Each of the wires is then inserted through an inductive opening, such as a bore 35 or 85, of one of the inductive elements such as ferrite beads 32, 80, or 81, which are to be between this first disk and a second disk such as a disk 11, 62, or 63. The wires are then drawn individually through the bores in the second disk, each of these bores in the second disk also being a capacitive opening when the second disk is constructed of electrically conducting material. When all of the wires are drawn through an opening in the second disk, the disk is slid axially along the wires until the beads are engaged oppositely between the first disk and the second disk. If a more complex filter is desired, the wires are individually inserted through the inductive openings of additional ferrite beads and then drawn through the capacitive or other openings of an additional disk, this additional disk then being slid axially toward the other disks until all of the adjacent disks and beads are engaged. Finally, the assembled wires, disks, and beads may be secured together by inserting them into an element, such as a sleeve 40 or 55.

Obviously, many modifications and variations of the present invention are possible in light of the above teachings. It is, therefore, to be understood that the invention may be practiced within the scope of the following claims other than as specifically described herein.

What is claimed is:

1. A feedthrough radio frequency filter for a plurality of physically parallel conductors, the filter comprising:
    a plate defining therein a plurality of parallel openings corresponding individually to said conductors, each conductor extending through the one of said openings corresponding to the conductor;
    a plurality of coverings constructed of dielectric material and corresponding individually to said conductors, each of said coverings circumscribing the one of said conductors corresponding to the covering and being disposed within the opening corresponding to said one conductor between said one conductor and said plate; and
    a plurality of inductive elements corresponding individually to said conductors, each of said inductive elements being juxtapositioned to the plate and to the one of said conductors corresponding to the inductive element.

2. The filter of claim 1 wherein said plate is constructed of electrically conductive material so as to define a capacitance between said plate and each of said conductors.

3. The filter of claim 1 wherein each of said coverings is an electrically insulating coating adhering to the one of said conductors corresponding to the covering.

4. The filter of claim 1 wherein each of said inductive elements is a bead constructed of ferrite material and disposed in circumscribing relation to the one of said conductors corresponding to the inductive element.

5. A feedthrough, radio frequency filter comprising:
a pair of electrically conducting elements disposed in spaced relation along a predetermined axis, each of said elements defining a plurality of openings extending through the element parallel to said axis, and each of said openings of one of said elements being aligned in a direction along said axis with a corresponding one of said openings of the other of said elements;
a plurality of elongated electrical conductors equal in number to the number of said openings defined by one of said elements, each of said conductors extending through one of said openings in one of said elements and through said corresponding one of said openings in the other of said elements;
dielectric material disposed in each of said openings of each of said elements, said dielectric material being disposed about the one of said conductors extending through the opening and being disposed between the conductor and the element; and
a plurality of inductive elements corresponding individually to said conductors and disposed between said electrically conductive elements, each of said inductive elements defining an opening extending through the inductive element in a direction along said axis, and the inductive element being disposed with the one of said conductors corresponding to the inductive element extending through the opening defined by the inductive element.

6. The filter of claim 5 wherein for each of said electrical conductors:
the electrical conductor is a continuous metal core;
said dielectric material is a continuous layer circumscribing said core and adhering thereto; and
said inductive element corresponding to the conductor is a bead circumscribing said layer.

7. The filter of claim 5 wherein each of said electrically conductive elements is a metal plate engaged with said beads.

8. The method of constructing a feedthrough radio frequency filter for a plurality of elongated wires, each wire having a continuous core of electrically conductive material and having a continuous layer of dielectric material disposed in circumscribing and covering relation to the core, wherein the method comprises:
constructing a plate of electrically conducting material, said plate defining a plurality of parallel capacitive openings extending through the plate, each of said capacitive openings corresponding to one of said wires, conforming to the transverse cross section of the one of said wires corresponding to the capacitive opening, and being slidably fitted to said one wire;
drawing each of the wires through the one of said capacitive openings corresponding to the wire;
obtaining a plurality of inductance increasing elements corresponding individually to each of said wires, each of said elements defining an inductive opening which extends through the element, conforms to the transverse cross section of the one of said wires corresponding to the element, and is slidably fitted to said one wire; and
inserting each of said wires through said inductive opening of said inductance increasing element corresponding to the wire.

9. The method of claim 8 wherein said inductance increasing element is a bead constructed of ferrite material.

10. The method of claim 8 wherein said plate is a first plate of electrically conducting material and wherein the method constructs a "pi" filter and further comprises:
constructing a second plate of electrically conducting material, said second plate defining a plurality of second parallel capacitive openings extending through the second plate, each of said second capacitive openings corresponding to one of said wires, conforming to the transverse cross section of the one of said wires corresponding to the second capacitive opening, and being slidably fitted to said one wire;
drawing each of the wires through the one of said second capacitive openings corresponding to the wire; and
sliding said second plate along said wires so that said inductance increasing elements are engaged oppositely by said first plate and said second plate.

11. The method of claim 8 wherein said plate is a first plate, which is constructed of electrically conducting material, and wherein the method constructs an "L" filter and further comprises:
constructing a second plate of electrically nonconducting material, said second plate defining a plurality of second parallel openings extending through the second plate, each of said second openings corresponding to one of said wires, conforming to the transverse cross section of the one of said wires corresponding to the second opening, and being slidably fitted to said one wire;
drawing each of the wires through the one of said second openings corresponding to the wire; and
sliding said second plate along said wires so that said inductance increasing elements are engaged oppositely by said first plate and said second plate.

12. A feedthrough radio frequency filter for a continuous, electrically conductive core and a covering of dielectric material circumscribing the core, the filter comprising:
a plurality of plates spaced along said core, each plate of said plurality thereof defining an opening through the plate, said opening being slidably and peripherally fitted to said covering and said core and said covering extending through said opening; and at least one of said plates being electrically conductive so that a capacitance, which has said covering as a dielectric, exists between said one of said plates and said core; and
an inductive element defining an opening extending through said inductive element and slidably and peripherally fitted to said covering, said core and said covering extending through said opening in said inductive element so that the inductance of said core is increased by said inductive element.

13. The filter of claim 12 wherein there are a pair of said plates which are adjacent and are electrically conductive and wherein said inductive element is disposed between the plates of said pair of plates so that said pair of plates and said inductive element define a "pi" filter for said core.

14. The filter of claim 12 wherein there are a pair of said plates which are adjacent, one plate of said pair being electrically conductive and the other plate of said pair being electrically nonconductive, and wherein said inductive element is disposed between the plates of said pair of plates so that said pair of plates and said inductive element define an "L" filter for said core.

15. The filter of claim 12 wherein said covering is a continuous layer extending along said core, said continuous layer being slidably received in each such opening in one of said plates and in said inductive element.

16. The filter of claim 15 wherein said inductive element is a bead constructed of ferrite material and having opposite axial ends engaged by a pair of said plates.

17. The filter of claim 12 wherein:
said core is one of a plurality of such cores extending in generally physical parallel relationship, each core of said plurality thereof having such a covering of dielectric material;
each of said plates has a plurality of said openings defined by the plate, each of said openings defined by the plate corresponding individually to one of said cores and having said one core and the covering corresponding thereto extending through the opening; and
said inductive element is one of a plurality of such inductive elements, each of said inductive elements corresponding individually to one of said cores and having said one core and the covering corresponding thereto extending through the opening defined by the inductive element.

18. A feed through radio frequency filter for use with a plurality of continuous wires extending in physically parallel relation along a predetermined axis, each wire having an electrically conductive core and a covering of dielectric material circumscribing the core, and the filter comprising:
a disk constructed of electrically conductive material and defining a plurality of capacitance openings extending axially through the disk, each of said openings being slidably fitted to said covering of one of said wires and having said one wire extended through said opening so as to define between said disk and said core of said one wire a capacitance having said covering as a dielectric; and
a plurality of generally cylindrical beads constructed of ferrite material, each of said beads defining a inductance opening extending through the bead and having opposite open ends, the bead being engaged at one of said ends with said disk and being aligned with a corresponding one of said capacitance openings, and said inductance opening being slidably fitted to said covering of one of said wires and having said one wire extended through said inductance opening so that said bead defines an inductance for said core.

19. The filter of claim 18 wherein said disk is a first disk of the filter and the filter further comprises a second disk engaging each of said beads at the other of said open ends of said inductance opening of said beads, said second disk defining a plurality of wire openings extending axially through said second disk, each of said wire openings being slidably fitted to said covering of one of said wires and being aligned with a corresponding inductance opening in one of said beads and having said one wire extended through said wire opening from said inductance opening.

20. The filter of claim 18 wherein the filter further comprises a sleeve internally receiving said first disk and said second disk and having means for securing said first disk and said second disk in axially aligned relation and in engagement with said beads.

* * * * *